United States Patent
Yamada et al.

(10) Patent No.: US 6,476,502 B2
(45) Date of Patent: *Nov. 5, 2002

(54) SEMICONDUCTOR DEVICE AND MANUFACTURING METHOD THEREOF

(75) Inventors: Satoshi Yamada; Michitaka Kimura; Masatoshi Yasunaga, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/517,050

(22) Filed: Mar. 2, 2000

(65) Prior Publication Data

US 2001/0042863 A1 Nov. 22, 2001

(30) Foreign Application Priority Data

Jul. 28, 1999 (JP) .............................. 11-214362

(51) Int. Cl.⁷ ...................... H01L 23/48; H01L 23/52; H01L 29/40
(52) U.S. Cl. .................. 257/778; 257/737; 257/738; 257/787; 257/723; 438/108; 438/112; 438/124
(58) Field of Search ................. 257/778, 777, 257/780, 707, 706, 784, 786, 686

(56) References Cited

U.S. PATENT DOCUMENTS

| | | | | |
|---|---|---|---|---|
| 4,933,744 A | * | 6/1990 | Segawa et al. ............... | 357/72 |
| 5,323,060 A | * | 6/1994 | Fogal et al. ................. | 257/777 |
| 5,610,442 A | * | 3/1997 | Schneider et al. ........... | 257/787 |
| 5,715,144 A | * | 2/1998 | Ameen et al. ............... | 361/790 |
| 5,784,264 A | * | 7/1998 | Tanioka ....................... | 361/803 |
| 5,866,949 A | * | 2/1999 | Scheuller ..................... | 257/778 |
| 5,872,700 A | * | 2/1999 | Collander .................... | 361/760 |
| 5,880,530 A | * | 3/1999 | Mashimoto et al. ........ | 257/783 |
| 5,895,976 A | * | 4/1999 | Morrell et al. .............. | 257/778 |
| 5,952,725 A | * | 9/1999 | Ball ............................ | 257/777 |
| 5,977,632 A | * | 11/1999 | Beddingfield ............... | 257/737 |
| 5,977,640 A | * | 11/1999 | Bertin et al. ................. | 257/777 |
| 6,229,215 B1 | * | 5/2001 | Egawa ........................ | 257/777 |
| 6,239,366 B1 | * | 5/2001 | Hsuan et al. .............. | 174/52.3 |

FOREIGN PATENT DOCUMENTS

| EP | 0782191 A2 | * 2/1997 | ................. 25/65 |
|---|---|---|---|
| JP | 6-209071 | 7/1994 | |
| JP | 10-256259 | 9/1998 | |
| KR | 1997-53159 | 7/1997 | |
| KR | 1999-14197 | 2/1999 | |

* cited by examiner

*Primary Examiner*—Steven Loke
*Assistant Examiner*—Nitin Parekh
(74) *Attorney, Agent, or Firm*—McDermott, Will & Emery

(57) ABSTRACT

An insulating resin sheet made from a thermosetting resin is provided on an insulating substrate in such a manner as to cover bonding pads provided on the insulating substrate. A lower chip is set on the insulating substrate in such a manner that bonding bumps connected to inner connection terminals of the lower chip break the insulating resin sheet 24 to be in contact with the bonding pads. The insulating resin sheet is thermally cured and subsequently the bonding bumps are melted.

20 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly to a semiconductor device containing a semiconductor chip connected to connection terminals by a flip-chip bonding method and a manufacturing method thereof.

2. Description of the Background Art

FIG. 14 is a sectional view of a prior art semiconductor device. The prior art semiconductor device shown in FIG. 14 includes a package 10 made from an insulating resin for forming the external shape, and an insulating substrate 12 provided on one side of the package 10. A plurality of external electrode terminals 14 arranged in a matrix are provided on a surface of the insulating substrate 12. Pads for wire bonding (W/B) are also provided on the other surface of the insulating substrate 12. Hereinafter, the surface of the insulating substrate 12 on which the external electrode terminals 14 are provided is called a "front surface" of the insulating substrate 12, and the surface of the same on which the pads for W/B are provided is called a "back surface" of the insulating substrate 12.

A plurality of semiconductor chips, i.e., a lower chip 16 and an upper chip 18 are molded in the package 10. Each of the lower chip 16 and the upper chip 18 includes a plurality of inner connection terminals on its one surface. Hereinafter, the surface of each chip on which the inner connection terminals are provided is called a "front surface" of the chip, and the other side surface thereof is called a "back surface" of the chip.

The back surface of the lower chip 16 is fixed to the insulating substrate 12 with a die bond resin 20. The front surface of the lower chip 16 has at its peripheral edge a space in which the plurality of inner connection terminals are arranged, and also has at its central portion a space for mounting the upper chip 18. The back surface of the upper chip 18 is fixed to the front surface of the lower chip 16 at the central space thereof with the die bond resin 20. The inner connection terminals of the lower chip 16 and the inner connection terminals of the upper chip 18 are connected to the pads for W/B of the insulating substrate 12 by means of respective inner connection wires 22 for W/B.

In the above-described. prior art semiconductor device, it is required to ensure on the lower chip 16 the space for disposing the inner connection terminals as well as the space for mounting the upper chip 18. Accordingly, in the structure of the prior art semiconductor device, it was necessary to make the lower chip 16 larger than the upper chip 18. Limitation that should be satisfied with the lower chip 16 are not only the above-described limitation of the size. Namely, the lower chip 16 should also meet a limitation regarding the layout of the inner connection terminals. For this reason, in general, a semiconductor device containing a plurality of semiconductor chips has been designed with difficulty.

There has been known a flip-chip bonding (FCB) method as the semiconductor chip bonding method in addition to the above-described W/B method. In the FCB method, a plurality of inner connection terminals provided on the surface of a semiconductor chip are bonded to pads provided on a substrate or the like via bumps.

SUMMARY OF THE INVENTION

The present invention has been conceived to solve the previously-mentioned problems, and a first object of the present invention is to connect part or all of a plurality of semiconductor chips contained in a single semiconductor device to connection terminals by making use of the FCB method, thereby eliminating the limitation in terms of the chip size.

A second object of the present invention is to make finer the arrangement pitch of inner connection terminals of a semiconductor chip by enhancing the dimensional accuracy of bumps used for the FCB method.

The above objects of the present invention are achieved by a semiconductor device having a plurality of semiconductor chips including a first semiconductor chip bonded by a flip-chip bonding method. The semiconductor device includes bonding bumps bonded to inner connection terminals formed on the front surface of the first semiconductor chip or metal films for covering the inner connection terminals. The semiconductor device also includes bonding pads bonded to the inner connection terminals of the first semiconductor chip via the bonding bumps. A thermosetting resin film is provided for surrounding the bonding bumps. In the inventive semiconductor device, a non-wetted region in which the bonding bump is not wetted is formed on the inner connection terminal or the metal film.

The above objects of the present invention are also achieved by a method of manufacturing a semiconductor device including a first semiconductor chip bonded by the flip-chip bonding method. In the inventive method, a thermosetting resin film is formed in such a manner as to cover a plurality of bonding pads to be conducted to inner connection terminals of the first semiconductor chip. The first semiconductor chip is set in such a manner that bonding bumps bonded to the inner connection terminals of the first semiconductor chip or metal films for covering the inner connection terminals are in contact with the bonding pads after penetrating the thermosetting resin film. Further, the thermosetting resin film is thermally cured after completion of the setting of the first semiconductor chip. Finally, the bonding bumps are melted after thermal curing of the thermosetting resin film for bonding the bonding bumps to the bonding pads.

Other objects and further features of the present invention will be apparent from the following detailed description when read in conjunction with the accompanying drawings.

DESCRIPTION OF THE PREFERRED EMBODIMENTS

Figure 1:
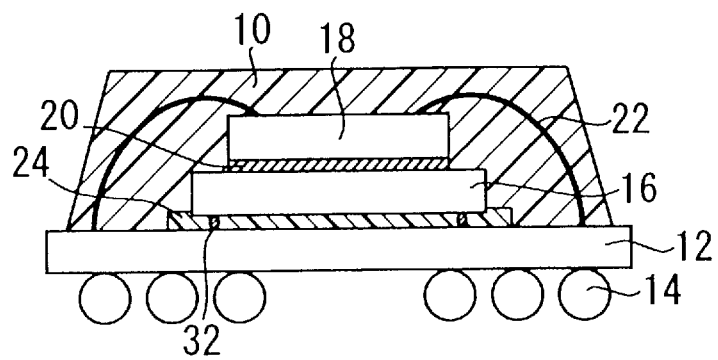
FIG. 1 is a sectional view of a semiconductor device according to a first embodiment of the present invention.

In the following, principles and embodiments of the present invention will be described with reference to the accompanying drawings. In the drawings, like or similar parts are designated by like reference numerals, and the overlapped explanation thereof is omitted.

First Embodiment

FIG. 1 is a sectional view of a semiconductor device according to a first embodiment of the present invention. The semiconductor device in this embodiment includes a package 10 made from an insulating resin (i.e., resin for transfer molding) for forming the external shape, and an insulating substrate 12 provided on one surface of the package 10. A plurality of external electrode terminals 14 arranged in a matrix are provided on the front surface of the insulating substrate (bottom surface in FIG. 1). Bonding pads are provided on the back surface (top surface in FIG. 1) of the insulating substrate 12.

A plurality of semiconductor chips, specifically, a lower chip 16 and an upper chip 18 are molded in the package 10. A plurality of inner connection terminals are provided on each of the front surface of the lower chip 16 (bottom surface in FIG. 1) and the front surface of the upper chip 18 (top surface in FIG. 1).

An insulating resin sheet 24 made from a thermosetting resin is disposed on the back surface (top surface in FIG. 1) of the insulating substrate 12. The front surface (on which the inner connection terminals are provided) of the lower chip 16 faces to the back surface of the insulating substrate 12 via the insulating resin sheet 24, and is connected to the insulating substrate 12 by the FCB method.

Figure 2:
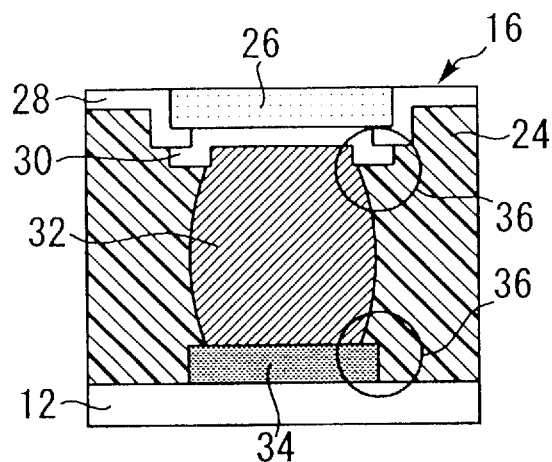
FIG. 2 is an enlarged view of one inner connection terminal provided in a semiconductor chip included in the semiconductor device according to the first embodiment of the present invention.

FIG. 2 is an enlarged view showing one inner connection terminal 26 provided in the lower chip 16 and its neighborhood. The inner connection terminal 26 of the lower chip 16 is formed of a metal pad made from aluminum or the like. The peripheral edge portion of the inner connection terminal 26 is covered with a glass coat 28. A portion, located at the opening of the glass coat 28, of the inner connection terminals 26 is covered with a metal film 30.

A connection bump 32 made from gold or solder is provided under the metal film 30. The metal film 30 is provided for ensuring wettability of the connection bump 32 to the inner connection terminal 26 of the lower chip 16. The metal film 30 is formed by depositing a metal film from above the glass coat 28 over the entire surface of the lower chip 16 and patterning the metal film by wet-etching. Since the metal film 30 is formed by the above-described formation step, the metal film 30 has a size equal to or more than that of the opening of the glass coat 28.

A bonding pad 34 corresponding to the connection bump 32 is provided on the insulating substrate 12. To be more specific, the lower chip 16 is mounted on the insulating substrate 12 in such a manner that all of the connection bumps 32 fixed on the lower chip 16 are in contact with the bonding pads 34 provided on the insulating substrate 12. In a case where the connection bump 32 is made from gold, there can be obtained a desired conduction state by making the connection bump 32 and the bonding pad 34 contact with each other. In a case where the connection bump 32 is made from solder, a desired conduction state can be ensured by forming an intermetallic junction between the connection bump 32 and the bonding pad 34.

In the process of manufacturing a semiconductor device in this embodiment, the lower chip 16 is mounted on the back surface of the insulating substrate 12 (on which the bonding pads 34 are present) after the insulating resin sheet 24 before thermal curing is disposed on the substrate 12. In the stage of mounting the lower chip 16 on the back surface of the insulating substrate 12 at a specific position, the insulating resin sheet 24 is broken by the connection bumps 32. This leads to a state in which the connection bumps 32 are in contact with the bonding pads 34 and the insulating resin sheet 24 accurately surrounds the external shapes of the connection bumps 32.

In the process of manufacturing a semiconductor device in this embodiment, the insulating resin sheet 24 is thermally cured at the same time when or after the lower chip 16 is mounted on the insulating substrate 12. After the insulating resin sheet 24 is thermally cured, the shapes of the bonding bumps 32 are restricted by the insulating resin sheet 24. To be more specific, even when the bonding bumps 32 are melted in order to be bonded to the bonding pads 34, the shapes of the bonding bumps 32 are kept as those restricted by the insulating resin sheet 24.

In this embodiment, the original shape (before melting) of the bonding bump 32 is determined such that a portion to be in contact with the metal film 30 of the bonding bump 32 is smaller than the metal film 30 and also a portion being in contact with the bonding pad 34 of the bonding bump 32 is smaller than the bonding pad 34. As a result, there are formed regions not wetted by the molten bonding bumps 32 (hereinafter, referred to as "non-wet regions 36") is formed at the peripheral edge portion of the metal film 30 and the peripheral edge portion of the bonding pad 34.

Figure 3:
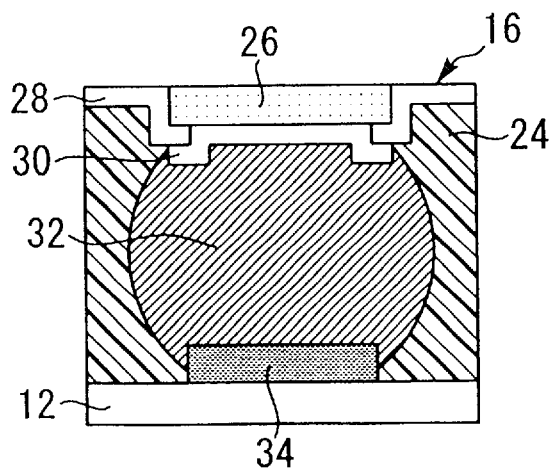
FIG. 3 is an enlarged view of an inner connection terminal provided in a semiconductor chip included in a semiconductor device in comparison with the first embodiment.

FIG. 3 is an enlarged view showing the inner connection terminal 26 of a semiconductor device to be in comparison with this embodiment and its neighborhood. A state shown in FIG. 3 is realized by thermally curing the insulating resin sheet 24 after melting the bonding bump 32. In this case, the external shape of the bonding bump 32 can be freely changed when the bonding bump 32 is melted. Accordingly, the molten bonding bump 32 is wetted over the metal film 30 and over the entire surface of the bonding pad 34. As a result, after being melted, the bonding bump 32 becomes wider than that shown in FIG. 2.

The shape of the bonding bump 32 becomes as shown in FIG. 3 not only in the case where the insulating resin sheet 24 is thermally cured after the bonding bump 32 is melted but also in the case where an opening is previously provided in the insulating resin sheet 24 for preventing interference with the bonding bump 32. To make finer the arrangement pitch of the inner connection terminals 26, it is advantageous to make finer the sizes of the connection bumps 32. Accordingly, the semiconductor device in this embodiment makes it possible to realize an advantageous state for making finer the arrangement pitch of the inner connection terminals 26.

The upper chip 18 is fixed on the back surface (top surface in FIG. 1) of the lower chip 16 with a die bond resin 20. The plurality of the inner connection terminals provided on the front surface (top surface in FIG. 1) of the upper chip 18 are connected to bonding pads of the insulating substrate 12 by means of an inner connection wire for W/B, respectively.

As described above, in the semiconductor device in this embodiment, the inner connection terminals 26 of the lower chip 16 are connected to the insulating substrate 12 by the FCB method suitable for making finer the arrangement pitch of the inner connection terminals 26, and the inner connection terminals of the upper chip 18 are connected to the insulating substrate 12 by the W/B method. The insulating substrate 12 contains wires for ensuring the connection between the lower chip 16 and the upper chip 18 and wires for ensuring the connection between the above wires and the external connection terminals 14.

According to the semiconductor device in this embodiment, it is possible to realize a desired wiring structure without applying W/B (wire bonding) to the lower chip 16. In other words, it is possible to realize the desired wiring structure without providing a space for wiring bonding on the lower chip 16. Also according to the semiconductor device in this embodiment, it is possible to realize the desired wiring structure while not concentrating the inner connection terminals 26 of the lower chip 16 at the peripheral edge portion of the lower chip 16 but freely laying out them. As a result, according to the structure in this embodiment, it is possible to reduce the limitations in terms of the chip size and the layout of the inner connection terminals, and hence to simplifying the design of a semiconductor device containing a plurality of chips.

While the surface of the inner connection terminal 26 of the lower chip 16 is covered with the metal film 30 in the above-described embodiment, the present invention is not limited thereto. If the bonding between the inner connection terminal 26 and the bonding bump 32 can be ensured, the metal film 30 may be omitted.

While the insulating resin sheet is previously interposed between the insulating substrate 12 and the lower chip 16 for restricting the external shapes of the bonding bumps 32 in the above-described embodiment, the present invention is not limited thereto. A liquid thermosetting resin may be used in place of the insulating resin sheet. In this case, the liquid thermosetting resin may be applied on the insulating substrate 12 before the lower chip 16 is mounted on the same so long as being thermally cured before the bonding bumps 32 are melted.

Second Embodiment

Figure 4:
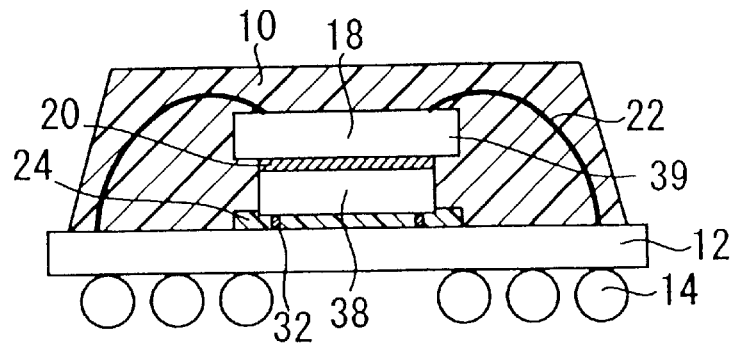
FIG. 4 is a sectional view of a semiconductor device according to a second embodiment of the present invention.

A semiconductor device according to a second embodiment of the present invention will be described with reference to FIG. 4.

The semiconductor device in this embodiment has the same configuration as that of the semiconductor device in the first embodiment except that a lower chip 38 is smaller than an upper chip 18. Resulting from the fact that the lower chip 38 is smaller than the upper chip 18, an overhang portion 39 protruded from the lower chip 38 is formed on the upper chip 18. According to the semiconductor device in this embodiment, like the first embodiment, there is no limitation in terms of the chip size, whereby it is possible to realize a desired wiring structure although the overhang portion 39 is formed on the upper chip 18.

Third Embodiment

Figure 5:
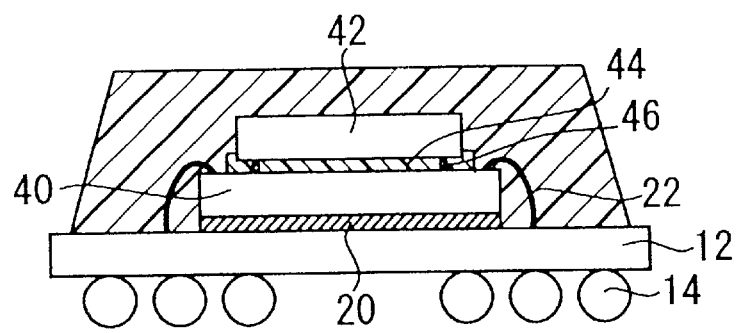
FIG. 5 is a sectional view of a semiconductor device according to a third embodiment of the present invention.

A semiconductor device according to a third embodiment of the present invention will be described with reference to FIG. 5.

The semiconductor device in this embodiment includes a lower chip 40 fixed to an insulating substrate 12 via a die bond resin 20, and an upper chip 42 connected to the front surface (on which inner connection terminals are provided) of the lower chip 40 by the FCB method.

The upper chip 42 is connected to the front surface of the lower chip 40 in accordance with the same manner as that used for connection of the lower chip 16 in the first embodiment. To be more specific, the upper chip 42 is mounted on the lower chip 40 via an insulating resin sheet 44 made from a thermosetting resin. Further, the upper chip 12 is connected to the lower chip 40 via bonding bumps 46.

On the front surface of the lower chip 40, inner connection terminals to be conducted to the insulating substrate 12 are arranged on the peripheral edge portion and inner connection terminals to be conducted to the upper chip 42 are arranged in a region on which the upper chip 42 is overlapped. The lower chip 40 is connected to the insulating substrate 12 by means of inner connection wires 22 for W/B.

In the semiconductor device in this embodiment, the shapes of the bonding bumps 46 for bonding the upper chip 42 to the lower chip 40 can be accurately controlled by the insulating resin sheet 44. As a result, according to the structure in this embodiment, it is possible to realize a state suitable for making finer both the arrangement pitch of the inner connection terminals of the upper chip 42 and the arrangement pitch of the inner connection terminals of the lower chip 40.

In the case where the upper chip 42 and the lower chip 40 are connected to each other by the FCB method, a signal transfer path between the chips can be made shorter than that in the case where they are connected to each other by the W/B method. As a result, according to the semiconductor device in this embodiment, it is possible to realize electrical characteristics (frequency characteristic and the like) superior to those of the semiconductor device in the first or second embodiment.

Fourth Embodiment

Figure 6:
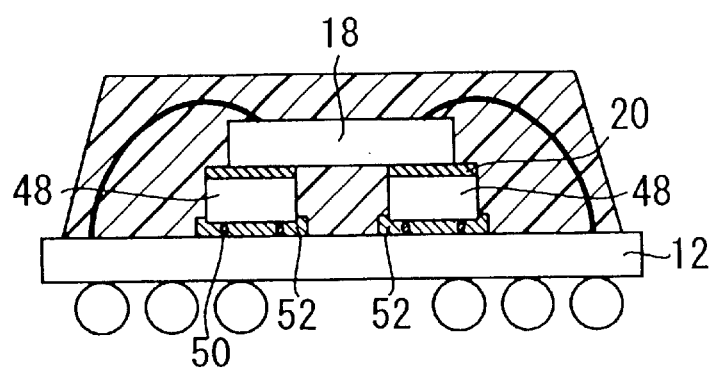
FIG. 6 is a sectional view of a semiconductor device according to a fourth embodiment of the present invention.

A semiconductor device according to a fourth embodiment of the present invention will be described with reference to FIG. 6.

The semiconductor device in this embodiment includes a plurality (for example, two) of lower chips 48. Like the lower chip 16 in the first embodiment, each of the lower chips 48 is connected to an insulating substrate 12 via bonding bumps 50 and an insulating resin sheet 52 by the FCB method. An upper chip 18 is fixed to the back surfaces (top surfaces in FIG. 6) of the plurality of lower chips 48 via a die bond resin 20. According to the structure of this embodiment, although the plurality of the lower chips 48 are provided while only one upper chip 18 is provided, it is possible to easily realize a wiring structure therebetween.

Fifth Embodiment

Figure 7:
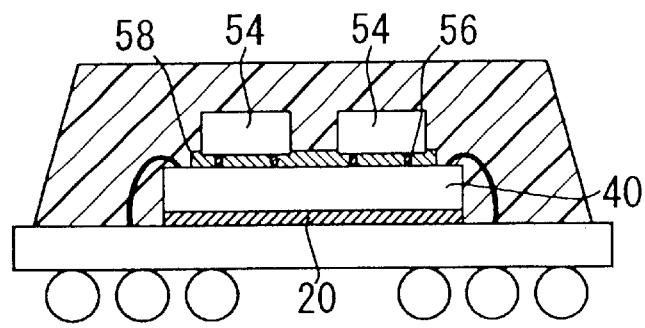
FIG. 7 is a sectional view of a semiconductor device according to a fifth embodiment of the present invention.

A semiconductor device according to a fifth embodiment of the present invention will be described with reference to FIG. 7.

The semiconductor device in this embodiment includes a plurality (for example, two) of upper chips 54. Like the upper chip 42 in the third embodiment, each of the upper chips 54 is connected to the front surface of a lower chip 40 (on which inner connection terminals are provided) via bonding bumps 56 and an insulating resin sheet 58 by the FCB method. According to the structure of this embodiment, although the plurality of the upper chips 54 are provided while only one upper chip 40 is provided, it is possible to easily realize a wiring structure therebetween.

Sixth Embodiment

Figure 8:
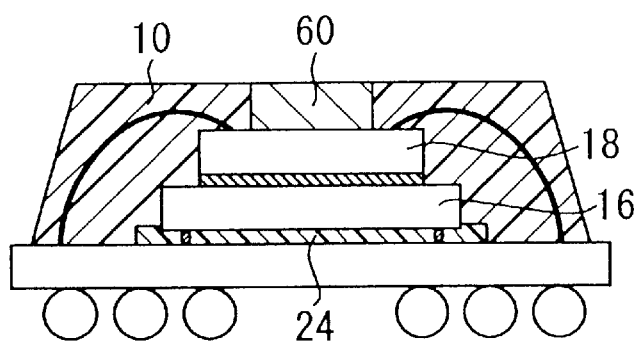
FIG. 8 is a sectional view of a semiconductor device according to a sixth embodiment of the present invention.

A semiconductor device according to a sixth embodiment of the present invention will be described with reference to FIG. 8.

The semiconductor device in this embodiment has the same structure as that of the semiconductor device in the first embodiment except that a heat radiation plate 60 is provided. The heat radiation plate 60 is made from a metal having a good thermal conductivity, and is provided in such a manner that one end surface thereof is in contact with an upper chip 18 and the other end surface is exposed to the outside of a package 10. According to the structure of this embodiment, it is possible to realize a semiconductor device superior in heat radiation to the semiconductor device in the first embodiment.

Seventh Embodiment

Figure 9:
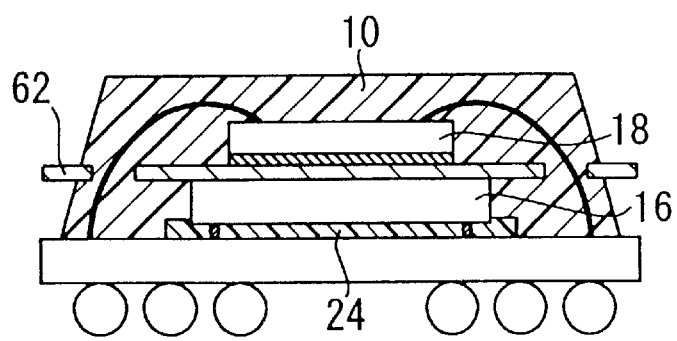
FIG. 9 is a sectional view of a semiconductor device according to a seventh embodiment of the present invention.

A semiconductor device according to a seventh embodiment of the present invention will be described with reference to FIG. 9.

The semiconductor device in this embodiment has the same structure as that of the semiconductor device in the first embodiment except that a heat radiation plate 62 is provided between a lower chip 16 and an upper chip 18. The heat radiation plate 62 is made from a metal having a good thermal conductivity, and is provided in such a manner as to extend to the outside of a package 10. According to the structure of this embodiment, it is possible to realize a semiconductor device superior in heat radiation to the semiconductor device in the first embodiment. Further, according to the structure of this embodiment, it is possible to effectively cool the lower chip 16 as compared with the semiconductor device in the sixth embodiment.

Eighth Embodiment

Figure 10:
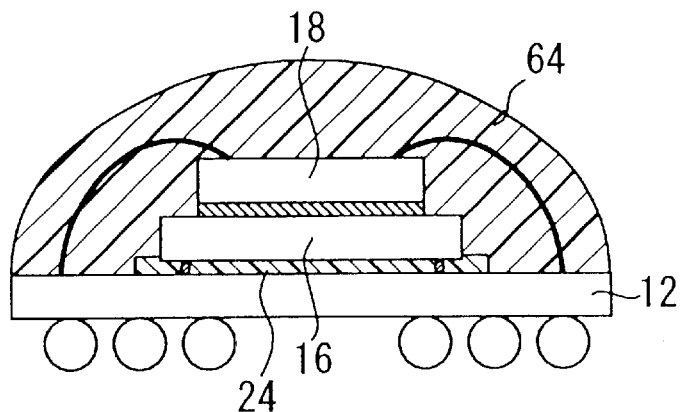
FIG. 10 is a sectional view of a semiconductor device according to a eighth embodiment of the present invention.

A semiconductor device according to an eighth embodiment of the present invention with reference to FIG. 10.

The semiconductor device in this embodiment has the same structure as that of the semiconductor device in the first embodiment except that a package 64 is made from a liquid resin. While the package of the semiconductor device is made from the resin for transfer molding in the embodiments 1 to 7, the resin for sealing the package is not limited thereto but may be a liquid resin as in this embodiment.

Ninth Embodiment

Figure 11:
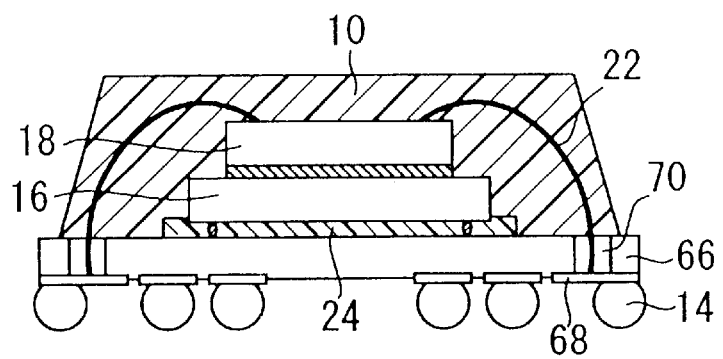
FIG. 11 is a sectional view of a semiconductor device according to a ninth embodiment of the present invention.

A semiconductor device according to a ninth embodiment of the present invention will be described with reference to FIG. 11. The semiconductor device in this embodiment includes an insulating substrate 66. Like the insulating substrate 12 in the first embodiment, the insulating substrate 66 includes on its front surface a plurality of external connection terminals 14.

Bonding pads 68 conducted to the external connection terminals 14 are provided on the front surface of the insulating substrate 66. The insulating substrate 66 has openings 70 for exposing the bonding pads 68 to the back surface side of the insulating substrate 66. Part or all of inner connection wires 22 for W/B connected to the semiconductor chip are bonded to the bonding pads 68 through the openings 70, so as to be thus conducted to the external connection terminals 14. According to the structure of this embodiment, it is possible to realize a desired wiring structure without providing wires connected to the external connection terminals 14 in the insulating substrate 66.

Tenth Embodiment

Figure 12:
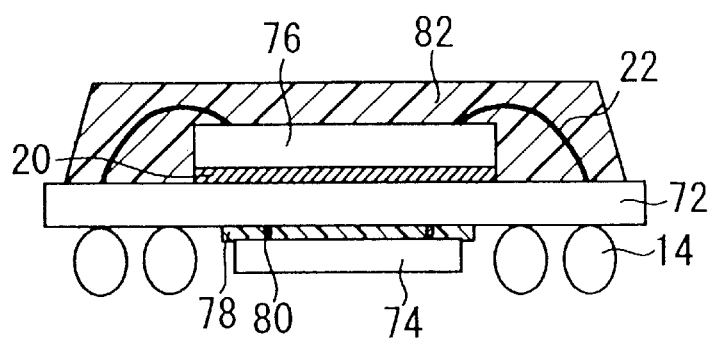
FIG. 12 is a sectional view of a semiconductor device according to a tenth embodiment of the present invention.

A semiconductor device according to a tenth embodiment of the present invention will be described with reference to FIG. 12. The semiconductor in this embodiment includes a first semiconductor chip 74 connected to the front surface of an insulating substrate 72 (on which external connection terminals 14 are provided), and a second semiconductor chip 76 connected to the back surface of the insulating substrate 72. Bonding pads are provided on each of the front surface and the back surface of the insulating substrate 72.

Like the lower chip 16 in the first embodiment, the first semiconductor chip 74 is connected to the insulating substrate 72 via an insulating resin sheet 78 and bonding bumps 80 by the FCB method. Like the upper chip 18 in the first embodiment, the second semiconductor chip 74 is connected to the insulating substrate 72 by the W/B method. The second semiconductor chip 74 is resin-molded by a package 82 for protecting inner connection wires for W/B.

According to the structure of this embodiment, since the shapes of the bonding bumps 80 can be accurately controlled, it is possible to make finer the arrangement pitch of inner connection terminals of the first semiconductor chip 74. Also, according to this embodiment, the first and second semiconductor chips 74 and 76 can be disposed on both the surfaces of the insulating substrate 72 without any limitation in terms of sizes of the chips and the inner connection terminals of each chip can be freely laid out. As a result, according to the structure of this embodiment, it is possible to simplify the design of a semiconductor device containing a plurality of semiconductor chips like the first embodiment.

Eleventh Embodiment

Figure 13:
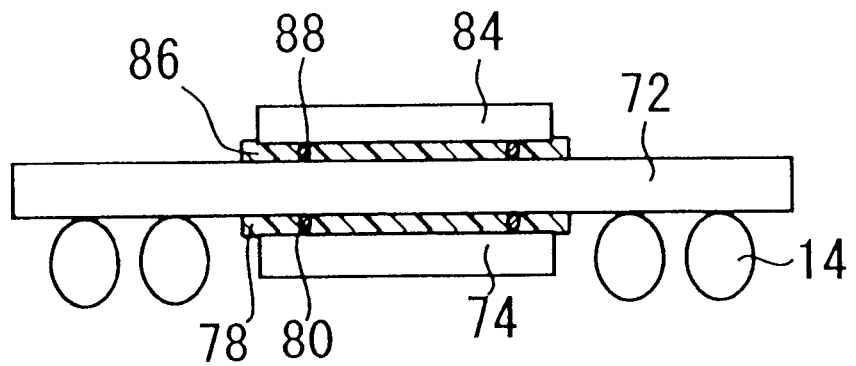
FIG. 13 is a sectional view of a semiconductor device according to a eleventh embodiment of the present invention.
Figure 14:
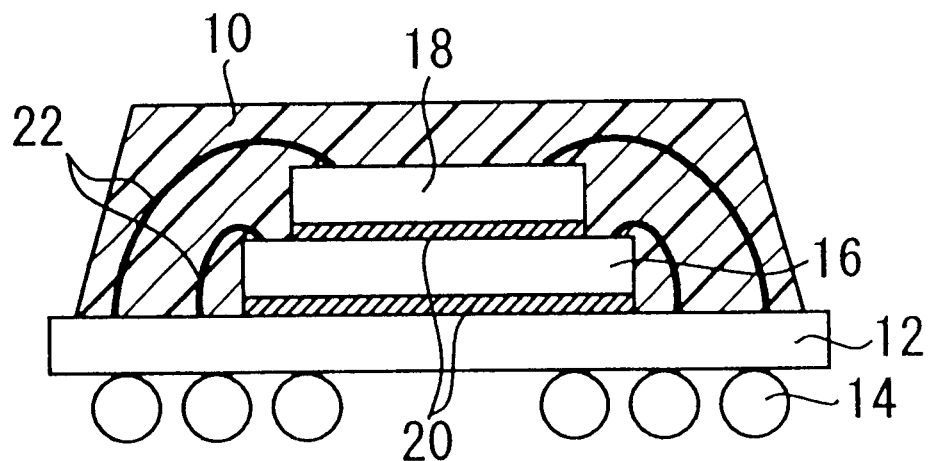
FIG. 14 is a sectional view of a conventional semiconductor device.

A semiconductor device according to an eleventh embodiment of the present invention will be described with reference to FIG. 13. The semiconductor device in this embodiment includes the same first semiconductor chip 74 as that in the tenth embodiment on the front surface of an insulating substrate 72 (on which external connection terminals 14 are provided), and a second semiconductor chip 84 on the back surface of the insulating substrate 72. the second semiconductor chip 84 is connected to the insulating substrate 72 via an insulating resin sheet 86 and bonding bumps 88 by the FCB method like the first semiconductor chip 74.

According to the structure of this embodiment, since the shapes of the bonding bumps 80 and 88 can be accurately controlled, it is possible to make finer the arrangement pitches of the inner connection terminals of the first and second semiconductor chips 74 and 84. Also, according to this embodiment, the first and second semiconductor chips 74 and 84 can be disposed on both the surfaces of the insulating substrate 72 without any limitation in terms of sizes of the chips and the inner connection terminals of each chip can be freely laid out. As a result, according to the structure of this embodiment, it is possible to simplify the design of a semiconductor device containing a plurality of semiconductor chips like the first embodiment.

The major benefits of the present invention described above are summarized as follows:

The semiconductor device according to the first aspect of the present invention is manufactured by controlling the external shape of each bonding bump in such a manner that a non-wetted region is formed in the associated inner connection terminal or the associated metal film. In the case where the external shapes of the bonding bumps are controlled as described above, it becomes possible to make narrower gaps between the inner connection terminals. As a result, according to the present invention, the arrangement pitch of the inner connection terminals of a first semiconductor chip bonded by the flip-chip bonding method is made finer.

According to the second aspect of the present invention, a semiconductor device containing a plurality of semiconductor chips is manufactured by stacking a first semiconductor chip bonded by the flip-chip bonding method to a second semiconductor chip bonded by the wire-bonding method.

According to the third aspect of the present invention, the first semiconductor chip bonded by the flip-chip bonding method is taken as a lower chip and the second semiconductor chip bonded by the wire-bonding method is taken as an upper chip. In this case, since the lower chip is not required to have a wire-bonding space, a limitation in terms of sizes of the two semiconductor chips is eliminated.

According to the fourth aspect of the present invention, it is possible to allow the second semiconductor chip as the upper chip to have an overhang portion by making use of the fact that there is no limitation in terms of sizes of the two semiconductor chips. In this case, since the degree of freedom in design of individual semiconductor chips can be largely ensured, the design of the semiconductor device is simplified.

According to the fifth aspect of the present invention, the second semiconductor chip bonded by the wire-bonding method is taken as a lower chip and the first semiconductor chip bonded by the flip-chip bonding method is taken as an upper chip. In this case, a signal transfer path between the two semiconductor chips is sufficiently shortened, whereby a semiconductor device having superior electrical characteristics is realized.

According to the sixth aspect of the present invention, since a heat radiation plate is provided in such a manner as to be overlapped on two semiconductor chips, sufficient heat radiation is ensured in the semiconductor chips.

According to the seventh aspect of the present invention, since a heat radiation plate is disposed between the first semiconductor chip and the second semiconductor chip, sufficient heat radiation is ensured in both the semiconductor chips.

According to the eighth aspect of the present invention, it is possible to bond inner connection wires for wire-bonding to bonding pads provided on the front surface of an insulating substrate via openings formed in the insulating substrate, and hence to simplify the wiring structure of the insulating substrate.

According to the ninth aspect of the present invention, it is possible to realize a semiconductor device in which the number of semiconductor chips disposed on the lower stage is different from that of semiconductor chips disposed on the upper stage. In this case, the degree of freedom in design of the individual semiconductor chips is largely ensure, and whereby the design of the semiconductor device is simplified.

According to the tenth aspect of the present invention, it is possible to realize a semiconductor device including a semiconductor chip bonded to the front surface, on which external connection terminals are provided, of an insulating substrate by the flip-chip bonding method.

According to the eleventh aspect of the present invention, it is possible to realize a semiconductor device including semiconductor chips bonded to the front surface and the back surface of an insulating substrate by the flip-chip bonding method.

According to the twelfth aspect of the present invention, it is possible to realize a semiconductor device including the first semiconductor chip bonded to the front surface of an insulating substrate by the flip-chip bonding method and the second semiconductor chip bonded to the back surface of the insulating substrate by the wire-bonding method.

According to the thirteenth aspect of the present invention, it is possible to protect a semiconductor chip bonded by the wire-bonding method by molding it with a transfer molding resin or a liquid resin.

According to the fourteenth aspect of the present invention, the external shapes of bonding bumps of a first semiconductor chip is surrounded with a thermosetting resin film when the first semiconductor chip is set in a specific state. Further, according to the present invention, the thermosetting resin film is thermally cured before melting the bonding bumps. In this case, the change in external shapes of the bonding bumps upon melting of the same is restricted by the thermosetting resin film. As a result, the external shapes of the bonding bumps are highly accurately controlled.

According to the fifteenth aspect of the present invention, the first semiconductor chip is bonded onto an insulating substrate by the flip-chip bonding method and the second semiconductor chip is bonded onto the semiconductor chip by the wire-bonding method. In this case, since it is not required to provide a wire-bonding space on the lower chip, a limitation in terms of sizes of the two semiconductor chips is eliminated.

According to the sixteenth aspect of the present invention, the second semiconductor chip is bonded onto an insulating substrate by the wire-bonding method and the semiconductor chip is bonded onto the second semiconductor chip by the flip-chip bonding method. In this case, since a signal transfer path between the two semiconductor chips can be shortened, a semiconductor device having good electrical characteristics is manufactured.

According to the seventeenth aspect of the present invention, since a heat radiation plate can be provided in such a manner as to be overlapped on two semiconductor chips, a semiconductor device having good heat radiation is manufactured.

According to the eighteenth aspect of the present invention, inner connection wires for wire-bonding is bonded to bonding pads provided on the front surface of an insulating substrate via openings provided in the insulating substrate.

According to the nineteenth aspect of the present invention, a package for protecting a semiconductor chip bonded by the wire-bonding method is formed by a transfer molding resin or a liquid resin.

According to the twentieth aspect of the present invention, there is manufactured a semiconductor device including the first semiconductor chip bonded to the front surface of an insulating substrate by the flip-chip bonding method and the second semiconductor chip bonded to the back surface of the insulating substrate by the wire-bonding method.

Further, the present invention is not limited to these embodiments, but variations and modifications may be made without departing from the scope of the present invention.

The entire disclosure of Japanese Patent Application No. Hei 11-214362 filed on Jul. 28, 1999 including specification, claims, drawings and summary are incorporated herein by reference in its entirety.

What is claimed is:

1. A semiconductor device having a plurality of semiconductor chips including a first semiconductor chip bonded by a flip-chip bonding method, the device comprising:

bonding bumps bonded to a metal portion of inner connection terminals formed on the front surface of said first semiconductor chip or metal films for covering said inner connection terminals;

bonding pads bonded to said inner connection terminals of said first semiconductor chip via said bonding bumps; and a thermosetting resin film for surrounding said bonding bumps;

wherein a non-wetted region in which said bonding bump is not wetted and a wetted region in which said bonding bump is wetted are formed on said metal portion of the inner connection terminal or said metal film, said non-wetted region is made from a metal material as is said wetted region; and a hardening temperature of said thermosetting resin is lower than a melting temperature of said bonding bumps.

2. The semiconductor device according to claim 1, further comprising an insulating substrate including on its front surface external connection terminals and bonding pads;

wherein said first semiconductor chip is connected to the front surface of said insulating substrate by the flip-chip bonding method.

3. The semiconductor device according to claim 2, wherein said insulating substrate includes bonding pads on its back surface side, and a second semiconductor chip is connected to the back surface side of said insulating substrate by the flip-chip bonding method.

4. The semiconductor device according to claim 2, wherein said insulating substrate includes bonding pads on its back surface side, and a second semiconductor chip is connected to said bonding pads provided on the back surface side of said insulating substrate by the wire-bonding method while being fixed to the back surface side of the same.

5. The semiconductor device according to claim 1, further comprising:

an insulating substrate including on its front surface external connection terminals and also including on its back surface bonding pads; and a second semiconductor chip which is stacked on said first semiconductor chip bonded by the flip-chip bonding method and is connected to said bonding pads by the wire-bonding method.

6. The semiconductor device according to claim 5, wherein said first semiconductor chip is connected to said insulating substrate by the flip-chip bonding method; and said second semiconductor chip is connected to said bonding pads of said insulating substrate by the wire-bonding method while being fixed on the back surface of said first semiconductor chip.

7. The semiconductor device according to claim 6, wherein said second semiconductor chip is larger than said first semiconductor chip, and an overhang portion protruded from said first semiconductor chip is formed on an end portion of said second semiconductor chip.

8. The semiconductor device according to claim 5, wherein said second semiconductor chip is connected to said bonding pads by the wire-bonding method while being fixed on the back surface of said insulating substrate; and said first semiconductor chip is connected to the front surface of said second semiconductor chip by the flip-chip bonding method.

9. The semiconductor device according to claim 5, further comprising a heat radiation plate stacked on said first semiconductor chip and said second semiconductor chip.

10. The semiconductor device according to claim 5, wherein at least said second semiconductor chip is molded with a transfer molding resin or a liquid resin.

11. A semiconductor device having a plurality of semiconductor chips including a first semiconductor chip bonded by a flip-chip bonding method, the device comprising:

bonding bumps bonded to inner connection terminals formed on the front surface of said first semiconductor chip or metal films for covering said inner connection terminals;

bonding pads bonded to said inner connection terminals of said first semiconductor chip via said bonding bumps;

a thermosetting resin film for surrounding said bonding bumps;

wherein a non-wetted region in which said bonding bump is not wetted and a wetted region in which said bonding bump is wetted are formed on said inner connection terminal or said metal film, said non-wetted region includes a region made from a material identical with that forming said wetted region, and a hardening temperature of said thermosetting resin is lower than a melting temperature of said bonding bumps;

an insulating substrate including on its front surface external connection terminals and also including on its back surface bonding pads;

a second semiconductor chip which is stacked on said first semiconductor chip bonded by the flip-chip bonding method and is connected to said bonding pads by the wire-bonding method; and a heat radiation plate stacked on said first semiconductor chip and said second semiconductor chip, wherein said heat radiation plate is disposed between said first semiconductor chip and said second semiconductor chip.

12. A semiconductor device having a plurality of semiconductor chips including a first semiconductor chip bonded by a flip-chip bonding method, the device comprising:

bonding bumps bonded to inner connection terminals formed on the front surface of said first semiconductor chip or metal films for covering said inner connection terminals;

bonding pads bonded to said inner connection terminals of said first semiconductor chip via said bonding bumps;

a thermosetting resin film for surrounding said bonding bumps;

wherein a non-wetted region in which said bonding bump is not wetted and a wetted region in which said bonding bump is wetted are formed on said inner connection terminal or said metal film, said non-wetted region includes a region made from a material identical with that forming said wetted region, and a hardening temperature of said thermosetting resin is lower than a melting temperature of said bonding bumps;

an insulating substrate including on its front surface external connection terminals and also including on its back surface bonding pads, wherein said insulating substrate includes on its front surface bonding pads conducted to said external connection terminals and also includes openings through which said bonding pads are exposed to the back surface side of said insulating substrate; and a second semiconductor chip which is stacked on said first semiconductor chip bonded by the flip-chip bonding method and is connected to said bonding pads by the wire-bonding method, wherein part or all of inner connection wires for wire-bonding connected to said second semiconductor chip are bonded to said bonding pads provided on the front surface of said insulating substrate through said openings.

13. A semiconductor device having a plurality of semiconductor chips including a first semiconductor chip bonded by a flip-chip bonding method, the device comprising:

bonding bumps bonded to inner connection terminals formed on the front surface of said first semiconductor chip or metal films for covering said inner connection terminals;

bonding pads bonded to said inner connection terminals of said first semiconductor chip via said bonding bumps;

a thermosetting resin film for surrounding said bonding bumps;

wherein a non-wetted region in which said bonding bump is not wetted and a wetted region in which said bonding bump is wetted are formed on said inner connection terminal or said metal film, said non-wetted region includes a region made from a material identical with that forming said wetted region, and a hardening temperature of said thermosetting resin is lower than a melting temperature of said bonding bumps;

an insulating substrate including on its front surface external connection terminals and also including on its back surface bonding pads; and a second semiconductor chip which is stacked on said first semiconductor chip bonded by the flip-chip bonding method and is connected to said bonding pads by the wire-bonding method, wherein the number of said first semiconductor chip is different from that of said second semiconductor chip stacked on said first semiconductor chip.

14. A method of manufacturing a semiconductor device including a first semiconductor chip bonded by the flip-chip bonding method, the method comprising the steps of:

forming a thermosetting resin film in such a manner as to cover a plurality of bonding pads to be conducted to inner connection terminals of said first semiconductor chip;

setting said first semiconductor chip in such a manner that bonding bumps bonded to said inner connection terminals of said first semiconductor chip or metal films for covering said inner connection terminals are in contact with said bonding pads after penetrating said thermosetting resin film;

thermally curing said thermosetting resin film after completion of the setting of said first semiconductor chip; and melting said bonding bumps after thermal curing of said thermosetting resin film for bonding said bonding bumps to said bonding pads.

15. The method of manufacturing a semiconductor device according to claim 14, wherein said first semiconductor chip is connected to the back surface of an insulating substrate including external connection terminals on its front surface by the flip-chip bonding method; and said method further comprising the steps of:

overlapping and fixing a second semiconductor chip having inner connection terminals on said first semiconductor chip in such a manner that said inner connection terminals of said second semiconductor chip are exposed; and bonding said inner connection terminals of said second semiconductor chip to bonding pads provided on the back surface of said insulating substrate by the wire-bonding method.

16. The method of manufacturing a semiconductor device according to claim 15, further comprising the step of:

providing a heat radiation plate so as to overlap said first semiconductor chip and said second semiconductor chip.

17. The method of manufacturing a semiconductor device according to claim 15, wherein said insulating substrate includes on its front surface bonding pads conducted to said external connection terminals and also includes openings through which said bonding pads are exposed to its back surface; and said method further comprising the step of bonding part or all of said inner connection terminals of said second semiconductor chip to said bonding pads provided on the front surface of said insulating substrate via said openings.

18. The method of manufacturing a semiconductor device according to claim 15, further comprising the step of forming a package for covering at least said second semiconductor chip by a transfer molding resin or a liquid resin.

19. A method of manufacturing a semiconductor device according to claim 14, wherein said first semiconductor chip is connected to the front surface of a second semiconductor chip having on its front surface inner connection terminals and bonding pads by the flip-chip bonding method; and said method further comprising the steps of;

fixing said second semiconductor chip on the back surface of an insulating substrate having external connection terminals on its front surface in such a manner that said inner connection terminals thereof are exposed; and bonding said inner connection terminals of said second semiconductor chip to bonding pads provided on the back surface of said insulating substrate by the wire-bonding method.

20. The method of manufacturing a semiconductor device according to claim 14, wherein said first semiconductor chip is connected to the front surface of an insulating substrate including on its front surface external connection terminals and bonding pads by the flip-chip bonding method; and said method further comprising the step of mounting a second semiconductor chip on the back surface of said insulating substrate by the flip-chip bonding method or the wire-bonding method.

* * * * *